United States Patent [19]

Hongo et al.

[11] Patent Number: 5,026,664
[45] Date of Patent: Jun. 25, 1991

[54] METHOD OF PROVIDING A SEMICONDUCTOR IC DEVICE WITH AN ADDITIONAL CONDUCTION PATH

[75] Inventors: Mikio Hongo; Katsuro Mizukoshi; Shuzo Sano; Takashi Kamimura, all of Yokohama; Fumikazu Itoh, Fujisawa; Akira Shimase; Satoshi Haraichi, both of Yokohama; Takahiko Takahashi, Iruma, all of Japan

[73] Assignee: Hitachi, Ltd., Tokyo, Japan

[21] Appl. No.: 334,145

[22] Filed: Apr. 6, 1989

[30] Foreign Application Priority Data

Apr. 7, 1988 [JP] Japan .................. 63-84203

[51] Int. Cl.⁵ .................. H01L 21/285; H01L 21/268
[52] U.S. Cl. ..................... 437/189; 437/24; 437/246; 437/192; 437/935; 437/173; 148/DIG. 93; 427/43.1; 427/53.1
[58] Field of Search ............. 437/935, 915, 245, 203, 437/192, 24, 173, 246, 189; 148/DIG. 50, DIG. 131, DIG. 158, DIG. 93; 427/38, 43.1, 53.1

[56] References Cited

U.S. PATENT DOCUMENTS

| | | | |
|---|---|---|---|
| 3,477,872 | 11/1969 | Amick | 437/187 |
| 3,785,862 | 1/1974 | Grill | 437/238 |
| 4,694,138 | 7/1987 | Oodaira et al. | 437/173 |
| 4,713,258 | 12/1987 | Umemura | 427/43.1 |
| 4,816,422 | 3/1989 | Yerman et al. | 437/51 |
| 4,853,341 | 8/1989 | Nishioka et al. | 437/935 |
| 4,876,112 | 10/1989 | Kaito et al. | 437/935 |
| 4,957,775 | 9/1990 | Black et al. | 427/53.1 |

FOREIGN PATENT DOCUMENTS 60-236214 11/1985 Japan.
60-236215 11/1985 Japan.
63-52442 3/1988 Japan.

OTHER PUBLICATIONS

Uesugi, F., et al., "Direct Writing...", Extended Abst. 17th Conf. Solid State Devices & Materials, Tokyo, 1985, pp. 193-196.

*Primary Examiner*—Brian E. Hearn
*Assistant Examiner*—T. N. Quach
*Attorney, Agent, or Firm*—Antonelli, Terry, Stout & Kraus

[57] ABSTRACT

A semiconductor IC device having a substrate, a patterned conductor layer for interconnection of regions in the substrate and a passivation layer covering the device is provided with an additional conduction path of a pattern and/or part of the patterned conductor layer is removed for disconnection for the purpose of evaluation of the characteristics of the device. The additional conduction path is formed by forming a hole in the passivation layer to expose a part of the conductor layer, directing, in an atmosphere containing a metal compound gas, an ion beam onto the hole and onto a predetermined portion of the passivation layer on which the additional conduction path of a pattern is to be formed to thereby form a patterned film of the metal decomposed from the metal compound gas and forming an additional conductor on the patterned film. The provision of the additional conduction path and/or the removal of part of the patterned conductor layer is preformed in a chemical vapor deposition apparatus which includes a vacuum chamber and an ion beam radiation unit having a housing partitioned into, for example, first, second and third compartments. The ion beam radiation unit has an ion source placed in the first compartment, an ion beam focusing and deflecting device placed in the second compartment and pressure buffer constituted by the third compartment. The third compartment is coupled to and pneumatically isolated from the vacuum chamber for conducting an ion beam emitted from the ion source, passing the second compartment and ejected from the second compartment to the vacuum chamber.

26 Claims, 9 Drawing Sheets

METHOD OF PROVIDING A SEMICONDUCTOR IC DEVICE WITH AN ADDITIONAL CONDUCTION PATH

BACKGROUND OF THE INVENTION

The present invention relates to a method of and apparatus for forming conductors on the surface of a semiconductor IC device and a semiconductor IC device having conductors formed by the method of and apparatus for forming conductors.

Aiming at higher performance and higher operation speed of a semiconductor IC devices, finer conductor width and higher degree of element integration are adopted in the semiconductor IC devices. This results in difficulty of development and prolongation of development period in semiconductor IC devices. This situation suggests that the trial-and-error circuit fabrication technique is necessary in LSI design as well. That is to say, a defective portion of a chip which does not function satisfactorily in the former design is located. A semiconductor IC device performing perfect operation is provisionally fabricated by cutting a conductor existing in the portion, providing a conductor in an arbitrary location and repairing a defective conductor. It becomes thus possible to perform the following characteristics evaluation and design alternation rapidly.

A method of evaluating VLSIs is reported in a Japanese journal "Semiconductor World", September 1987, pp. 27 to 32. The method comprises the steps of opening holes in a passivation layer located at the surface of an LSI chip and an insulating film between layers by using an FIB (focused ion beam), exposing a part of a wiring conductor or a patterned conductor layer, introducing CVD gas, and forming a metal conductor by using the FIB in the same way.

Further, a scheme of forming a Mo wiring conductor on a Si substrate covered with $SiO_2$ by using a laser CVD technique for the purpose of evaluation of a semiconductor IC device is described in Extended Abstracts of the 17th Conference on Solid State Devices and Materials, Tokyo, 1985, pp. 193 to 196.

JP-A-60-236214 (laid open Nov. 25, 1985) and JP-A-60-236215 (laid open Nov. 25, 1985) disclose forming a thin film having thickness of 100 or less as a seed for absorbing the laser beam and then radiating the laser beam to perform CVD to form a wiring conductor material into a film.

U.S. Ser. No. 134460 filed Dec. 17, 1987 and assigned to the assignee of the present invention discloses opening a hole for connection in a passivation layer of a semiconductor IC device, cutting a wiring conductor, forming a buffer film on the passivation layer, and forming a metal conductor layer thereon for the purpose of evaluation of the semiconductor IC device.

U.S. Ser. No. 32753 filed Mar. 31, 1987 and assigned to the assignee of the present invention discloses forming a wiring conductor on a passivation layer of a semiconductor IC device by using laser CVD or ion beam CVD and opening a hole in the passivation layer by using an FIB for the purpose of evaluation of the semiconductor IC device.

JP-A-63-52442 (laid open Mar. 5, 1988) discloses directing, in a non-oxidizing atmosphere, a laser beam onto a wiring conductor pattern for the purpose of reducing the resistance of the wiring conductor pattern formed over a substrate of a semiconductor IC device.

SUMMARY OF THE INVENTION

An object of the present invention is to provide a method of and an apparatus for providing an additional conduction path of a pattern over an uppermost insulation layer of a semiconductor IC device and/or cutting a patterned conductor layer formed in the semiconductor IC device for the purpose of evaluation of the characteristics of the semiconductor IC device.

Another object of the present invention is to provide a method of and an apparatus for providing an additional conduction path of a pattern over an uppermost insulating layer of a semiconductor IC device without exerting a bad influence upon the semiconductor IC device for the purpose of evaluation of the characteristics of the semiconductor IC device.

In accordance with an aspect of the present invention, a semiconductor IC device having a substrate, a patterned conductor layer for interconnection of regions in the substrate and a passivation layer covering the device is provided with an additional conduction path of a pattern and/or a part of the patterned conductor layer is removed for disconnection for the purpose of evaluation of the characteristics of the device. The additional conduction path is formed by forming a hole in the passivation layer to expose a part of the conductor layer, directing, in an atmosphere containing a metal compound gas, an ion beam onto the hole and onto a predetermined portion of the passivation layer on which the additional conduction path of a pattern is to be formed to thereby form a patterned auxiliary conduction film of the metal decomposed from the metal compound gas and forming an additional conductor on the patterned film.

In accordance with another aspect of the present invention, the provision of the additional conduction path and/or the removal of part of the patterned conductor layer for disconnection is performed in an interconnection modifying apparatus which includes a vacuum chamber and an ion beam radiation unit or ion beam optical system. The ion beam radiation unit has a housing partitioned into a plurality of compartments capable of being evacuated to different reduced pressures. The ion beam radiation unit has an ion source for emitting an ion beam placed in one of the compartments, an ion beam focusing and deflecting device placed in one of the compartments and pressure buffer constituted by another one of the compartments. The compartment in which to place the ion beam source is lower the reduced pressures to which the other compartments are evacuated. The compartment constituting the pressure buffer is coupled to and pneumatically isolated from the vacuum chamber for conducting an ion beam emitted from the ion source, having passed through the focusing and deflecting device.

In accordance with another aspect of the present invention, opening a hole in an insulating film layer (passivation layer) of a semiconductor IC device, forming an auxiliary conduction film on only a conductor path by using a focusing ion beam, and condensing and directing, in an atmosphere containing a metal compound gas, a laser beam onto the auxiliary conduction film to thereby form an additional wiring conductor of metal on the auxiliary condition film are performed without exposure to an oxygen atmosphere.

Since the laser beam is not directly directed onto an underlayer portion of a semiconductor IC device such as especially a diffusion region of the semiconductor IC device owing to the existence of the auxiliary conduction film, overheating can be prevented. Since the device is hardly affected by the structure of the underlayer, an additional wiring conductor having a constant film thickness and a constant width can be formed. Since the contact resistance of the connection portion can be made small, favorable connection can be obtained.

In an apparatus for implementing the above described method, the characteristics evaluation and design alteration can be rapidly performed by locating a defective portion of a semiconductor IC device.

In a semiconductor IC device having an additional wiring conductor formed by the above described method, characteristics evaluation and design alteration by repairing a defective location can be rapidly performed.

Further, a wiring conductor having low resistance can be formed by forming an additional wiring conductor of metal and then condensing and directing, in a non-oxidizing atmosphere, a laser beam onto the additional wiring conductor.

Since the auxiliary conduction film comprises a material adhering closely to the insulation layer and the additional wiring conductor of metal, the wiring material does not peel from the surface of the semiconductor IC device and occurrence of crack in the wiring material after being formed can be prevented. Since the auxiliary conduction film has a high absorption factor with respect to the laser beam causing the CVD phenomenon, the wiring material can be precipitated even if laser output is not increased, resulting in CVD with fine controllability. That is to say, the wiring can be formed even under high speed scanning with the laser beam. Since the auxiliary conduction film absorbs and/or reflects the greater part of energy of laser beam and allows only a part thereof to pass therethrough, only a small amount of energy is transmitted to the underlayer through the wiring, resulting in a reduced thermal influence.

DESCRIPTION OF THE PREFERRED EMBODIMENTS

Figure 1:
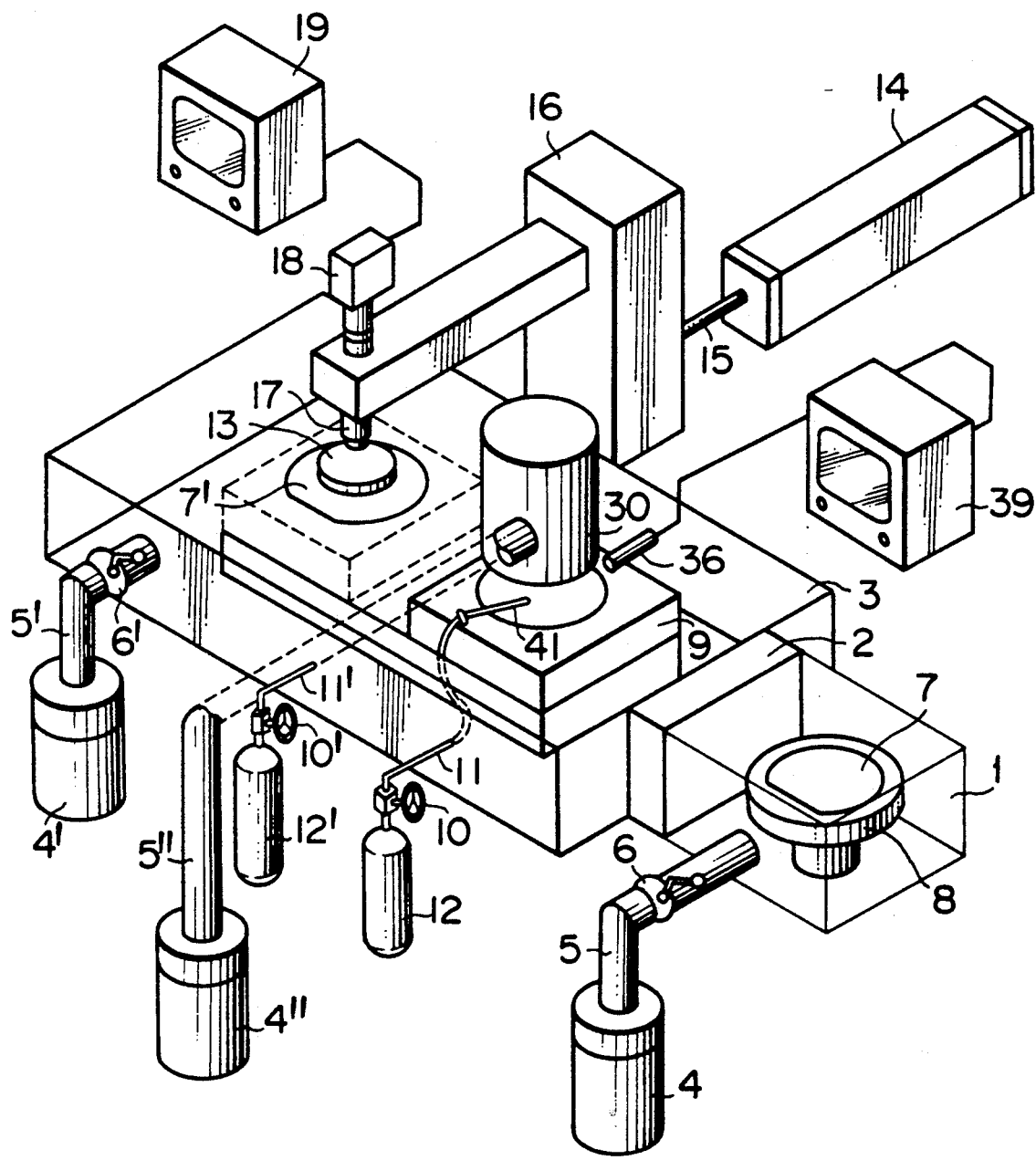
FIG. 1 is a whole configuration diagram of an interconnection modifying apparatus according to an embodiment of the present invention.
Figure 2:
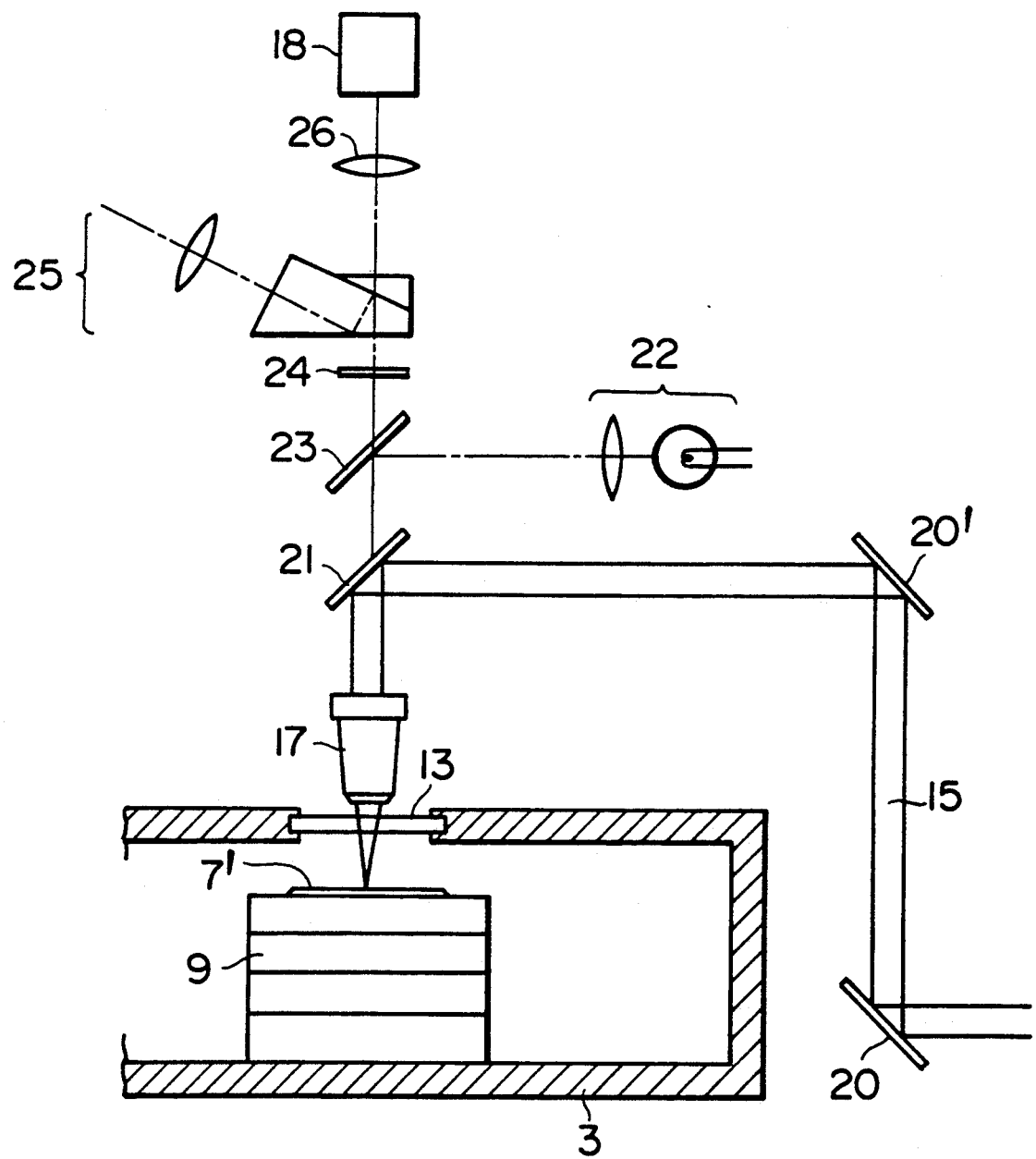
FIG. 2 is a configuration diagram of a laser optical system included in the apparatus of FIG. 1.

FIG. 1 shows the whole configuration of an interconnection modifying apparatus according to an embodiment of the present invention. As shown in FIG. 1, a load lock chamber 1 is coupled to a main chamber 3 via a gate valve 2. The load lock chamber 1 and the main chamber 3 are so configured that they may be evacuated respectively by vacuum pumps 4 and 4' via piping 5 and 5' and valves 6 and 6', respectively. In the load lock chamber 1, a support 8 for placing a wafer 7 (or a chip as occasion demands) thereon is disposed. The support 8 is so configured that the wafer 7 may be moved onto an X-Y-$\theta$-Z stage 9 in the main chamber 3 by transport mechanism (not illustrated) while maintaining the vacuum state. Further, the main chamber 3 is connected to CVD raw material gas cylinders 12 and 12' via valves 10 and 10' for adjusting the flow and piping 11 and 11', respectively. Further, a window 13 for transmitting a laser beam is so opened that a laser beam 15 oscillated by an Ar ion laser oscillator 14 may be condensed by an objective lens 17 via a laser optical system 16 and directed onto the wafer 7'. A television camera 18 is attached to the laser optical system 16 so that the surface of the wafer 7' may be observed by using a monitor 19. As shown in FIG. 2, the laser optical system 16 is so configured that the laser beam 15 may be applied to a dichroic mirror 21 by reflecting mirrors 20 and 20' and applied to the objective lens 17 by the dichroic mirror 21. The laser optical system 16 is further configured so that the laser beam applied to the objective lens 17 may be condensed while being transmitted through the window 13 and the laser beam thus condensed may be directed onto the wafer 7' placed on the stage 9. Further, the laser optical system 16 further comprises an illuminating source optical system 22, a half mirror 23, a laser beam cutting filter 24, an optical system 25 for observing the wafer face with the eye (omitted in FIG. 1), a camera lens 26 and a television camera 18.

Returning to FIG. 1, the main chamber 3 further comprises an ion beam optical system or an ion beam radiation unit 30 and is so configured that the inside of the ion beam optical system 30 may be kept at a degree of vacuum of not higher than $1 \times 10^{-7}$ Torr independently by a vacuum pump 4" and piping 5".

By using a secondary electron detector 36 installed within the chamber 3 and a monitor 39, a scanning ion microscope image of the wafer face under processing is observed.

Figure 3A:
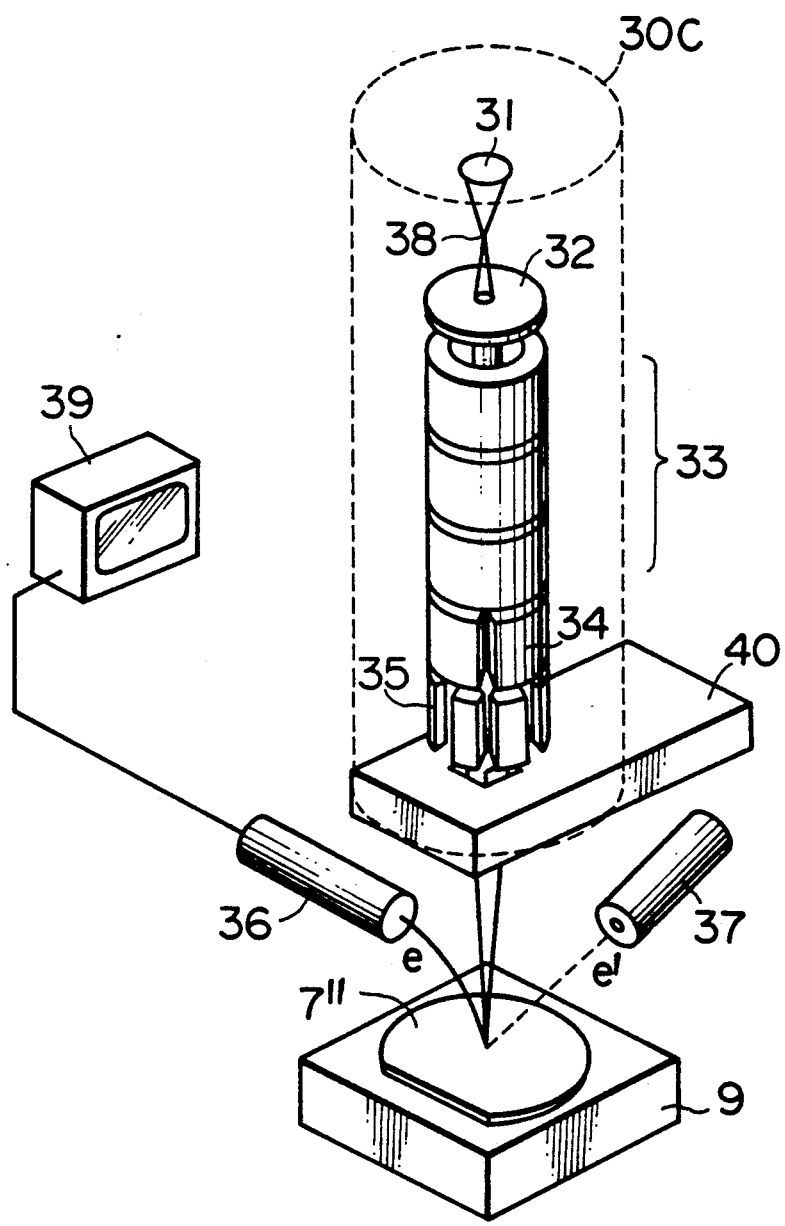
FIGS. 3A and 3B are configuration diagrams of an ion beam optical system included in the apparatus of FIG. 1.
Figure 3B:
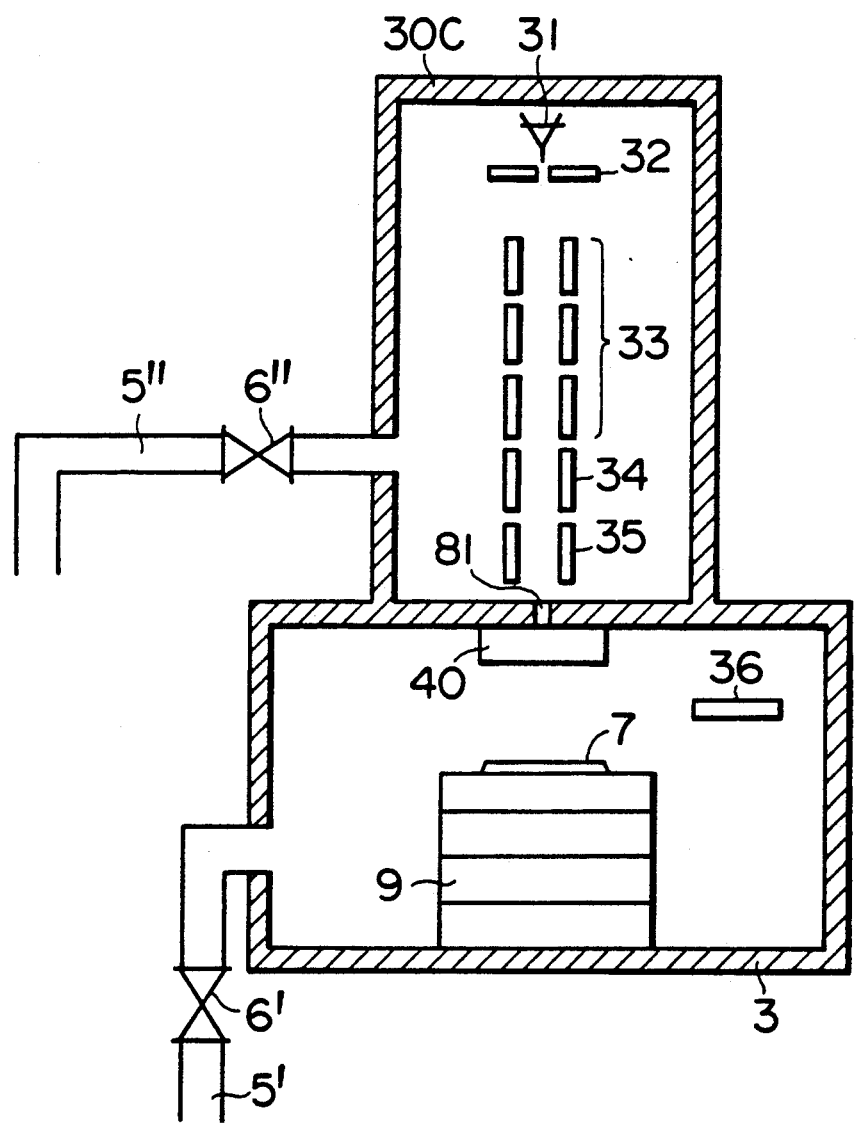

As shown in FIGS. 3A and 3B, the ion beam optical system or the ion radiation unit 30 comprises an ion source (for example, a liquid metal ion source such as Ga) 31, an extracting electrode 32 disposed under the ion source 31, an electrostatic lens 33, a blanking electrode 34, a deflector electrode 35, a secondary electron detector 36, an electron shower 37, a housing 30C containing the ion beam optical system 30 therein as indicated by broken lines, and a gate valve 40 installed between the ion beam optical system 30 and the main chamber 3. The housing 30C is coupled to and pneumatically isolated from the main chamber 3. Referring now to FIG. 3B, numeral 81 denotes a pinhole for leading the ion beam into the main chamber 3, and numerals 5" and 6" respectively denote piping and a valve coupled to the vacuum pump 4" (FIG. 1) for evacuating the housing 30C.

As shown in FIG. 1, a nozzle 41 for blowing CVD gas is disposed in close vicinity to the position whereto the ion beam 38 is directed.

Operation of respective portions and interconnection forming procedure will now be described.

The wafer 7 having performance to be evaluated has a plurality of semiconductor IC chips, each of which includes at least one semiconductor IC device. A semiconductor IC device comprises, for example, a semiconductor substrate having one or more semiconductor regions, a patterned conductor layer formed on the semiconductor substrate via an insulating layer, and a passivation layer covering the semiconductor IC device.

In order to form an additional conduction path of a predetermined pattern and/or cut a part of the patterned conductor layer for the purpose of evaluation of characteristics, the wafer 7 is placed on the support 8 included in the load lock chamber 1, and the load lock chamber 1 is hermetically sealed. Then the valve 6 is opened, and the load lock chamber 1 is evacuated to approximately $1 \times 10^{-7}$ Torr by the vacuum pump 4. In some cases, the degree of vacuum of $1 \times 10^{-5}$ is permitted. Thereafter, the gate valve 2 is opened to place the wafer 7 on the X-Y-Z-$\theta$ stage 9 within the main chamber 3 by using transport mechanism (not illustrated) and then the gate valve 2 is closed. At this time, the inside of the main chamber 3 is kept at high degree of vacuum close to $1 \times 10^{-7}$ Torr.

The wafer 7' indicates the state of the wafer 7 moved to just underside of the laser transmitting window 13 by the stage 9. While observing the wafer 7' by using the objective lens 17, the television camera 18 and the monitor 19, the wafer 7' is adjusted in Z and 0 directions. Thereafter, the reference position of the chip whereon an additional conductor should be formed (such as a target mark or a specific position of the chip) is registered, and the wafer is moved to just underside of the ion beam optical system 30 by driving the stage 9.

Here, preliminary registering is performed by using the laser optical system 16, the objective lens 17, the television camera 18 and the monitor 19. However, this is not necessarily required. Registering may be performed while observing a scanning ion microscope image obtained by using the ion beam optical system 30, the secondary electron detector 36 and the monitor 39 as described later. Referring again to FIG. 3A, the ion beam 38 is emitted from the ion source 31 upon application of high voltage (such as, for example, 10 to 20 kV) to the extracting electrode 32. The ion beam 38 is focused to 0.1 to 0.5 $\mu$m$\phi$ by the electrostatic lens 33 and directed onto the wafer 7". (At this time, the gate valve 40 is in the open state.) By scanning the ion beam 38 in X and Y directions by using the deflector electrode 35, sputtering working of a certain region can be performed. Further, by displaying a signal obtained from the secondary electron detector 36 in synchronism with a signal applied to the deflector electrode 35 on the monitor 39, the surface of the wafer 7" can be observed as a scanning ion microscope image. The electron shower 37 functions to keep the chip surface from being positively charged by the ion beam 38. Power supply for heating the ion source 31 and power supply for electrodes 32, 34 and 35, the electrostatic lens 33 and the electron shower 37 are not illustrated. By observing the scanning ion microscope image on the monitor 39, the reference position of the chip is registered to, for example, the center of the optical axis of the ion beam optical system 30. Thereafter, the stage 9 is driven in accordance with the design data to move the center of the optical axis to a position of a patterned conductor layer to be cut or a position whereat an additional conductor is to be formed. At this time, the ion beam 38 is bent by the blanking electrode 34 and does not arrive at the chip.

When the movement has been finished, the ion beam 38 is radiated for a necessary time by taking the undeflected optical axis as the center. In case of disconnection, the scanning region is set so as to be wider than the conductor width (and so that the ion beam may not be applied to adjacent conductors). In case of connection, the scanning region is so set as to be nearly equal to the conductor width. The radiation time can be set by measuring the working speed beforehand. Instead, means for monitoring the working depth may be used. By repeating the working by the use of the ion beam 38 and movement of the stage 9, disconnection of a predetermined portion of a patterned conductor layer and window opening with respect to a patterned conductor to be electrically connected by using an additional conductor scheduled to be formed later (i.e., formation of a hole for exposing a part of the patterned conductor layer) are finished. In the present embodiment, observation using secondary electrons generated by radiation of the ion beam has been described. However, observation using secondary ions can also be used jointly. Especially as means for monitoring the working depth, a method using secondary ions is effective, but is not mentioned further.

The stage 9 is then driven to move the start point (connection hole) wherefrom an additional conductor should be formed to the radiation position of the ion beam 38. The valve 10 is then opened, and $Cr(CO)_6$ gas sublimated from crystals of $Cr(CO)_6$ contained in the cylinder 12 is blown from the nozzle 41 through the piping 11 upon the vicinity of a place on the chip whereto the ion beam 38 is radiated. Under this state, the ion beam 38 is radiated under the condition that the beam is out of focus, i.e., the beam has a diameter ranging from 1 to 5 $\mu$m$\phi$. Or the beam 38 is radiated under the condition that the beam is on focus, i.e., the beam has a diameter ranging from 0.1 to 0.5 $\mu$m$\phi$, while scanning the beam in a direction perpendicular to the direction of travelling of the stage 9 so that the scanning width may have a value ranging from 1 to 5 $\mu$m. While the ion beam is being radiated, the stage 9 is moved in accordance with the required path of the additional conductor. When the ion beam 38 arrives at the end point of the interconnection (i.e., the other connection hole), the radiation is finished. The speed of the stage 9 at this time is so selected that the film of Cr may have a thickness ranging from 100 to 300 Å, for example.

By using the ion beam radiation, it is thus possible to form an auxiliary conduction film of Cr having a film thickness value ranging from 100 to 300 Å on the internal wall of the junction hole and on the interconnection path over the passivation film without exposing the wafer to the atmosphere.

This patterned auxiliary conduction film is conductive and functions to provide close adherence between the passivation film and an additional conductor formed on the auxiliary conduction film and mitigate the influence of laser radiation used when the additional conductor is formed upon the semiconductor substrate. Since the resistance value is too large, it is not suitable to use the patterned auxiliary conduction film as it is as a wiring conductor.

It is also possible to form a thick Cr film (Cr wiring) by making the travelling speed of the stage 9 sufficiently slow or by moving the stage 9 on the same path many times. Since an extremely long time is required, however, it is not practical. Further, this auxiliary conduction film is capable of fulfilling the above described function sufficiently with a film thickness approximately ranging from 100 to 300 Å.

After the auxiliary conduction film has been formed, the gate valve 40 is closed. The main chamber 3 is then evacuated to approximately $1 \times 10^{-7}$ Torr, and the stage 9 is driven to move the wafer 7' to just underside of the window 13. By using the objective lens 17, the television camera 18 and the monitor 19 via the window 13, a certain position on the chip (such as a target mark) is squared with a marker on the monitor 19 (i.e., an arbitrary reference point on the monitor 19). And the stage 9 is driven in accordance with design dimensions to square the center of the connection hole of wiring to be formed with the marker. This marker indicates the position whereat the radiated laser beam 15 is focused.

In the laser CVD technique used in the present embodiment, thermal energy generated at the position where the laser beam is applied resolves and deposits raw material gas for CVD adhering to the heat generation position or floating in the vicinity.

The valve 10' is opened to introduce CVD gas from the CVD raw material gas cylinder 12' into the main chamber 3 via the piping 11'. Herewith, the valve 6' is closed to confine CVD gas with constant pressure. Here, Mo(CO)$_6$ (molybdenum carbonyl) is used as CVD gas, and adjustment is performed to obtain the pressure close to 0.1 Torr. As occasion demands, inert gas such as Ar or He may be introduced to raise the pressure nearly to the atmospheric pressure.

Since Mo(CO)$_6$ is a white solid body at room temperature and steam pressure caused by sublimation is low, the cylinder 12', the valve 10' and the piping 11' may be heated at a temperature lower than the temperature whereat Mo(CO)$_6$ is decomposed (not illustrated).

Ar laser 15 is then oscillated from the Ar laser oscillator 14, and condensed by the laser optical system 16 and the objective lens 17. The laser beam thus condensed is applied to a portion of the wafer 7' whereat a hole is opened and a conductor layer is exposed (hereafter referred tb as connection hole). Depending upon the laser output, Mo can be precipitated within the connection hole in 2 to 30 seconds. After the inside of the connection hole has been filled up with Mo, the laser beam 15 is interrupted by a shutter (not illustrated), and the stage 9 is moved by a control unit (not illustrated) by a design dimension or a preset dimension to square a portion to be connected (an exposed portion of the patterned conductor layer) with the marker to be paired therewith. After the registration has been completed, the shutter is opened to radiate the laser beam 15 and fill up the inside of the connection hole with Mo.

In case a plurality of locations are connected, the above described operation is repeated. When filling up at all locations is completed, connection between filled up portions, i.e., formation of an additional conductor is performed. First of all, registering is performed with respect to one of the filled up portions. Thereafter, the stage 9 is moved at constant speed in accordance with a path preset by the auxiliary conduction film to form a Mo conductor while the laser beam 15 is being radiated. When the Mo conductor thus formed has arrived at another filled up portion, radiation of the laser beam 15 is stopped. In case a plurality of additional conductors are to be formed, the above described operation is repeated. Such filling up holes and forming an additional conductor are achieved by turning on and off the laser beam 15 and moving the stage 9. If points to be connected are inputted as coordinates beforehand, however, they can be automatically performed by using conventional sequence control, numerical control or their combination.

In the present embodiment, Cr(CO)$_6$ is used as CVD raw material gas for forming an auxiliary conduction film and Mo(CO)$_6$ is used as CVD raw material gas for forming an additional conductor, a Cr film and a Mo conductor being respectively formed. As any CVD raw material gas, however, metal carbonyl such as Mo(CO)$_6$, Cr(CO)$_6$, W(CO)$_6$ or Ni(CO)$_4$, a halogen compound such as MoF$_6$, WF$_6$ or MOCl$_5$, or alkyl compound such as Al(CH$_3$)$_3$, Cd(CH$_3$)2 or Al(iso-Butyl)$_3$ (tri-isobutyl aluminum) may be used. Further, an identical raw material gas may be used for forming both the auxiliary conduction film and the additional conductor.

After all of conductor formation has been finished, the valve 6 is opened to evacuate Mo(CO)$_6$. Thereafter, the laser beam condensed in accordance with the conductor path is applied onto the formed additional conductor as occasion demands. The degree of vacuum at this time is desired to be $10^{-5}$ Torr or less. Owing the this processing, the film quality of the conductor is improved and a conductor having a lower resistance value is obtained. Especially in a conductor formed from a carbonyl compound, this effect is significant. When the thickness of an additional conductor is 0.5 $\mu$m, for example, a laser beam of 3 $\mu$m$\phi$ is radiated in a nonoxidizing atmosphere with energy ranging from 200 to 500 mW/$\mu$m$^2$.

Even if laser is radiated in an atmosphere comprising an inert gas such as He or Ar or a reducing gas such as N$_2$ gas or H$_2$ instead of vacuum, therefore, the same effect is obtained. After evacuation with approximately $10^{-7}$ Torr is performed and the stage 9 is moved to the transport position, the gate valve 2 is opened to move the wafer 7'' onto the support 8 included in the load lock chamber 1. After the gate valve 2 has been closed, an inert gas is preferably introduced into the load lock chamber 1 until the atmospheric pressure is reached. The wafer 1 is taken out and the interconnection modification is thus completed.

Figure 4A:
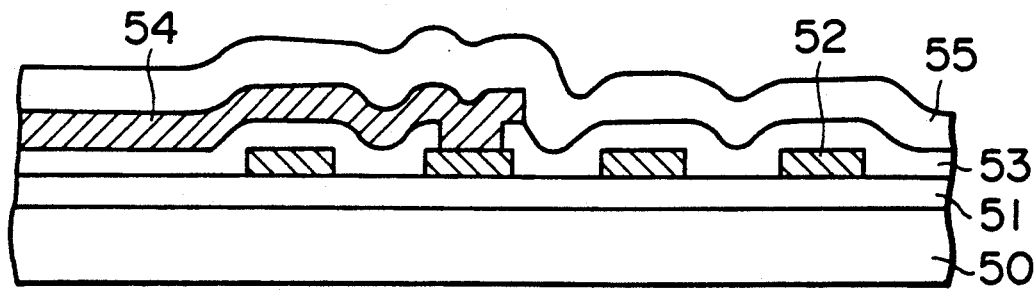
FIGS. 4A to 4D are diagrams for explaining respective steps of an interconnection modifying method according to an embodiment of the present invention.

By referring to FIGS. 4A to 4D, an interconnection modification method according to an embodiment of the present invention will now be described. FIG. 4A is a sectional view of a semiconductor IC device having characteristics to be evaluated. In the present embodiment, formation of an additional conductor and/or partial disconnection of a patterned conductor layer may be effected with respect to a wafer having a large number of semiconductor IC devices thereon or to a chip having a single semiconductor IC device thereon.

A semiconductor IC device comprises a Si substrate 50, a patterned conductor layer including Al wiring conductors 52 of a first layer formed on the Si substrate via a SiO$_2$ layer 51 and Al wiring conductors 54 of a second layer formed thereon via an interlayer insulating layer 53, and a passivation layer 55 formed on the patterned conductor layer in order to guard the wafer.

Figure 4B:
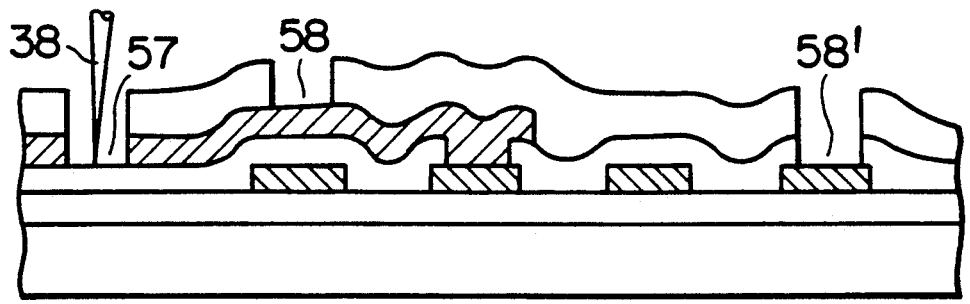

As shown in FIG. 4B, windows or holes 58 and 58' passing through the passivation layer 55 and through the interlayer insulating layer 53, if necessary, are formed by working by the use of a focused ion beam 38 in order to generate disconnection 57 in the wiring conductor 54 and expose a part of the conductor 52 to be connected.

Figure 4C:
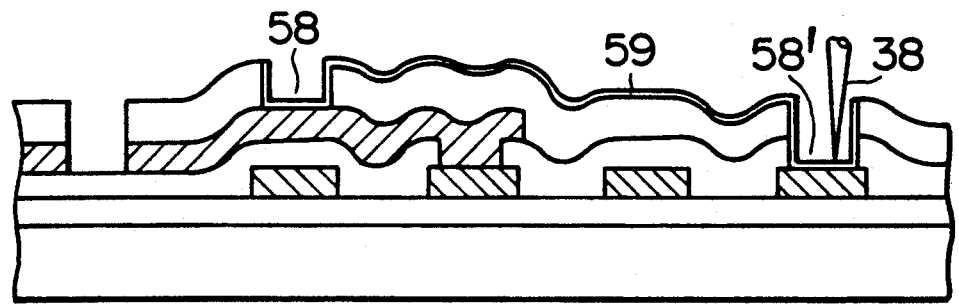
Figure 4D:
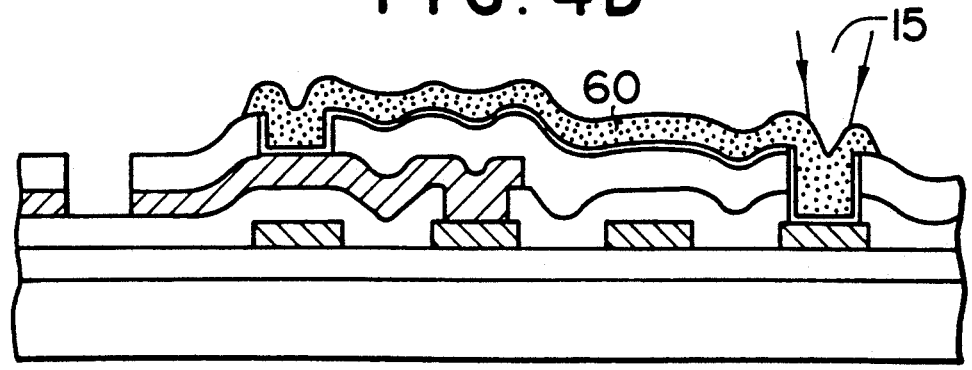

As shown in FIG. 4C, a film 59 (such as a chromium film) adhering well to the passivation layer 55 and having conductivity and a high absorption factor with respect to the laser beam is then formed by ion beam CVD only on internal walls of the connection holes 58 and 58' and on the conductor path over the passivation layer 55 (along a predetermined pattern) so that the device may not be exposed to the air and an auxiliary conduction film having thickness ranging from 100 to 300 Å may be formed. Thereafter, an additional Mo conductor 60 is formed as shown in FIG. 4D by condensing (focusing) and radiating an Ar laser beam in an atmosphere of $Mo(CO)_6$ gas.

After the additional Mo conductor 60 has thus been formed in accordance with a predetermined pattern, the wafer is moved while the Ar laser beam 15 condensed in a non-oxidizing atmosphere like vacuum, $N_2$ gas, an inert gas such as Ar or He, or a reducing gas such as $H_2$ is being radiated, if necessary. The Ar laser beam is thus radiated onto the additional Mo conductor 60 to improve the film quality. By radiating the laser beam onto all additional Mo conductors, the interconnection modification is completed.

Here, Ar laser is used as the laser beam source. However, any laser beam source may be used so long as the laser has such a wavelength that the laser beam may be absorbed into the auxiliary conduction film and converted into heat. However, continuous oscillation is preferred. For example, krypton (Kr) laser, YAG laser (fundamental frequency oscillation or harmonics oscillation) and C02 laser in case the dimension of the worked portion is allowed, can be mentioned.

Further, the Cr film 59 has a transmission factor of approximately 14% with respect to Ar laser light when the film thickness is 300 Å. When the film thickness is 600 Å, the transmission factor is approximately 2%. The transmission factor does not change significantly even for other laser light sources. Therefore, thermal influence caused by radiation of laser beam onto the underlayer can be prevented. Further, the Cr film 59 absorbs the laser beam and generates heat. Hence the resolving reaction is caused and the Mo film is precipitated. Accordingly, the influence of the underlayer such as the thickness of the passivation layer and presence/absence of an Al conductor is slight. Therefore, changes in film thickness of the Mo conductor 60 and in conductor width are also slight. Further, the Cr film itself has lower reflection factor and lower thermal conductivity as compared with an Al conductor. As compared with the case where the Cr film 59 is not present, the additional Mo conductor 60 can be formed by a lower laser output. When the same output is used, the additional Mo conductor can be formed at a higher speed. Since a series of processing steps can be performed in the same apparatus, oxide is not generated on the surfaces of the Al wiring conductors 52 and 54 or on the surface of the Cr auxiliary conduction film 59. Favorable interconnection having small connection resistance can be formed.

Figure 5:
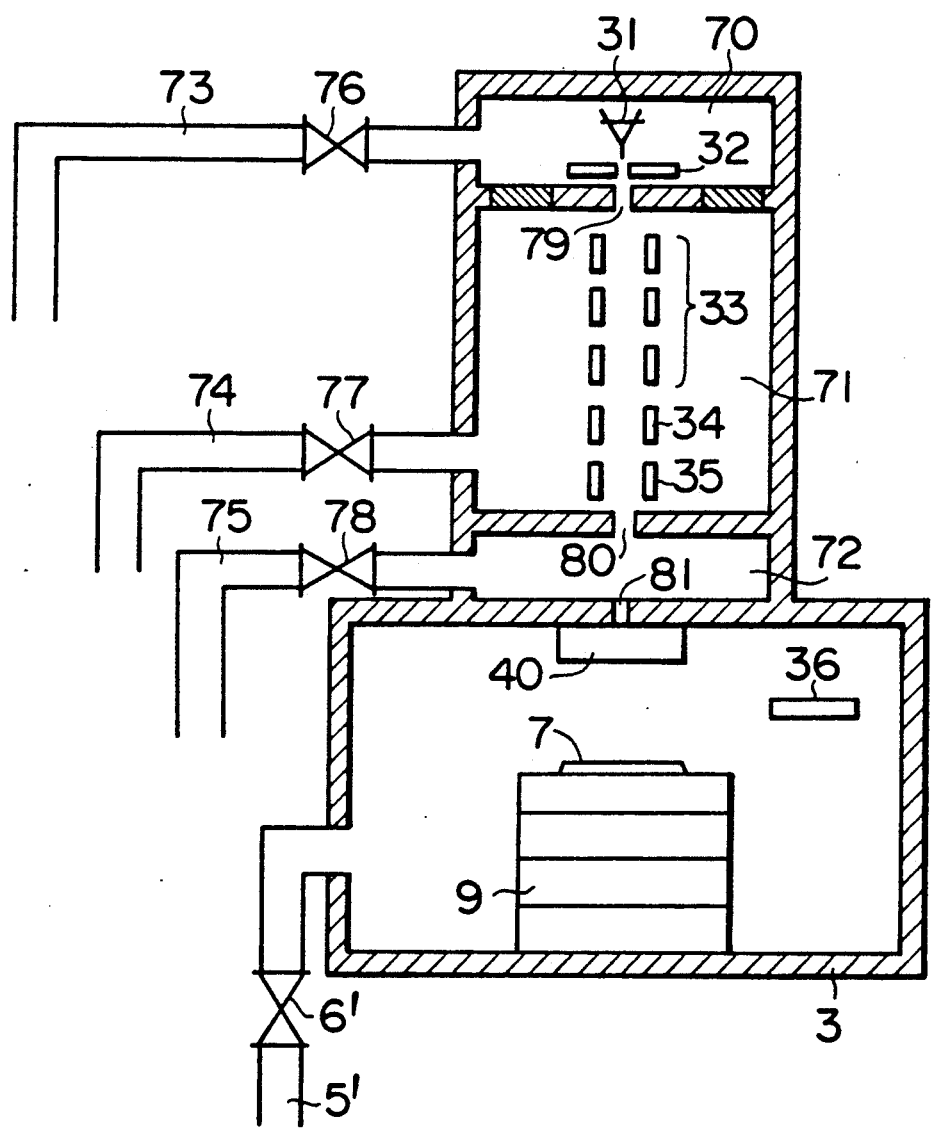
FIG. 5 is a configuration diagram of an ion beam optical system of an interconnection modifying apparatus according to another embodiment of the present invention.

Another embodiment of an interconnection modifying apparatus according to the present invention will now be described by referring to FIG. 5.

In the present embodiment, another example of the ion beam optical system shown in FIGS. 1, 3A and 3B is used. The chamber housing the ion beam optical system therein is divided into an ion source section (a first compartment) 70 housing the ion source 31 and the extracting electrode 32 therein, an optical system section (a second compartment) 71 housing the electrostatic lens 33, the blanking electrode 34 and the deflector electrode 35 therein, and a buffer section (a third compartment) 72 for mitigating the pressure difference between the main chamber 3 and the optical system section 71. Respective sections 70, 71 and 72 are evacuated by a vacuum pump independently via piping 73, 74 and 75 and valves 76, 77 and 78, respectively.

Between the sections 70 and 71 and between the sections 71 and 72, partitions respectively having pinholes 79 and 80 for passing the ion beam are provided. The third compartment 72 of the ion beam optical system is coupled to and pneumatically isolated from the main chamber 3. Between the compartment 72 and the main chamber 3 as well, therefore, the pinhole 81 and the gate valve 40 are provided. When an auxiliary conduction film is formed (along the pattern of an additional conductor) only on a conductor path to be provided with an additional conductor, the main chamber 3 can be filled with CVD gas for forming the auxiliary conduction film with predetermined pressure. That is to say, in the first embodiment, CVD gas is blown by the nozzle, but the gas concentration at the radiation section of the ion beam 38 cannot be raised. In the present embodiment, however, the gas concentration can be raised to a necessary value of concentration (gas pressure). That is to say, a degree of vacuum as high as $1 \times 10^{-7}$ Torr is required in the ion source section 70. Even if CVD gas is introduced into the main chamber up to approximately $1 \times 10^{-1}$ Torr, for example, the degrees of vacuum of $1 \times 10^{-3}$ Torr, $1 \times 10^{-5}$ Torr and $1 \times 10^{-7}$ Torr can be assured in the buffer section 72, the optical system section 71 and the ion source section 70, respectively. It is a matter of course that the gate valve 40 is preferably closed excepting when the ion beam 38 is radiated onto the wafer 7.

Since in the present embodiment the concentration of CVD gas can be raised, the film forming speed can be increased and hence the time required for forming the auxiliary conduction film can be shortened. In case an additional conductor having short length such as approximately 10 to 20 µm is to be formed, the conductor can also be formed directly by filling the main chamber 3 with $Mo(CO)_6$ with predetermined pressure. Although the chamber for the ion beam radiation unit shown in FIG. 5 is divided into three, it may be divided into a plurality of compartments capable of being evacuated to two or more different reduced pressures. For example, the buffer section 71 may be constituted by two or more compartments evacuated to different reduced pressures, with the ion source section 70 and the optical system section 71 being placed in one and the same compartment. One compartment may provide a pressure difference of about $10^{-2}$ Torr. When a particularly high degree of evacuation for the ion source section 70 is required, the sections 70 and 71 should be placed in different compartments even with a buffer section of two or more compartments, as shown in FIG. 5. Further, the electrostatic lens 33 and the blanking electrode 34 may be placed in different compartments.

Figure 6A:
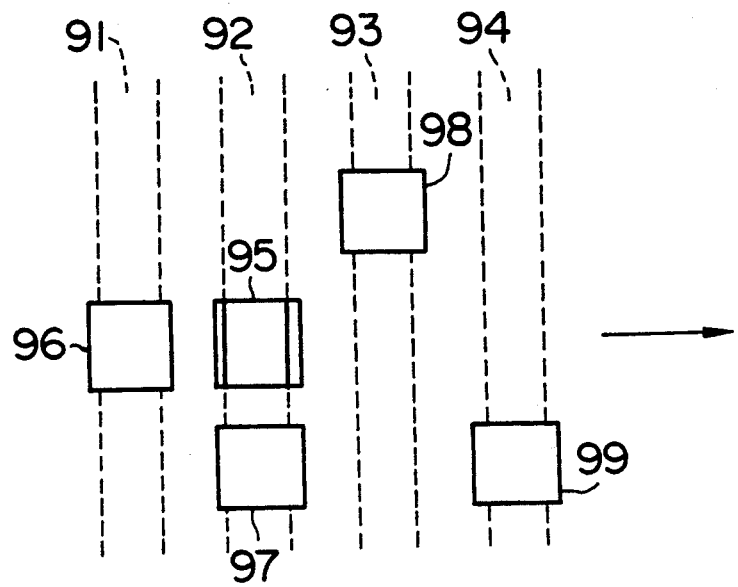
FIGS. 6A to 6C are diagrams for explaining an interconnection modifying method according to still another embodiment of the present invention.
Figure 6B:
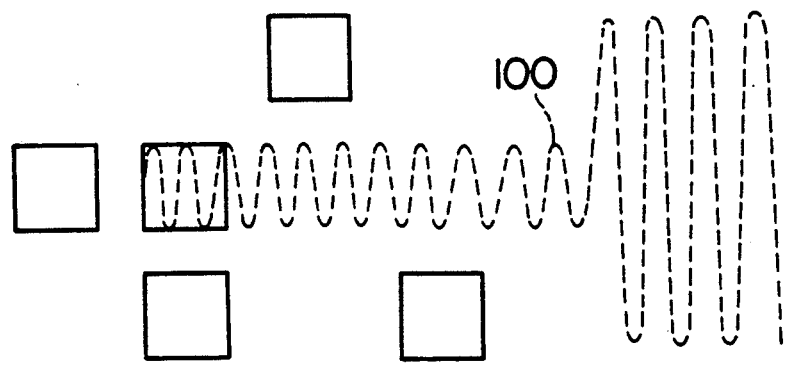
Figure 6C:
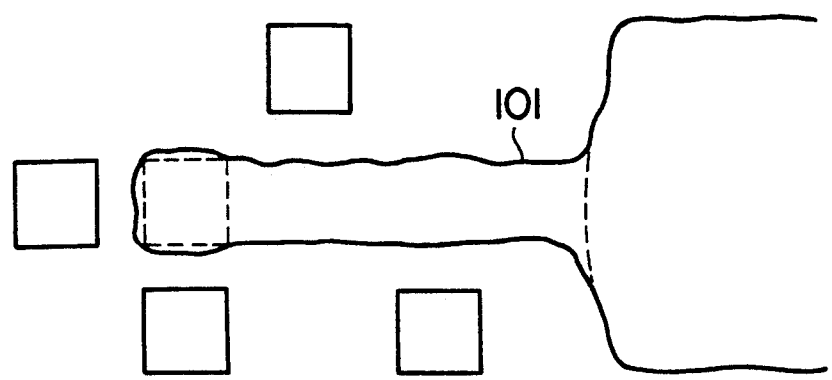

Another embodiment of an additional conductor forming method according to the present invention will now be described by referring to FIGS. 6A to 6C.

In the case considered in the present embodiment, a part of fine high-density conductor must be connected to a wiring conductor separated from a signal line but it cannot be connected thereto by forming an additional conductor by using only laser CVD because there are many obstacles (such as disconnections) around a connection hole. In case of FIG. 6A, a conductor must be formed in a direction indicated by an arrow from a connection hole 95 formed on a conductor 92 included in Al wiring conductors 91, 92, 93 and 94 existing under the passivation layer. Since disconnection portions 96, 97, 98 and 99 are present around the connection hole 95, there is a fear that a conductor formed by using laser CVD might fill up a disconnection portion and cause short-circuit with an unnecessary portion. As shown in FIG. 6B, therefore, an auxiliary conduction film is formed by scanning the ion beam in a CVD gas atmosphere for the auxiliary conduction film. A locus 100 of the ion beam is represented by a broken line.

That is to say, the scanning width is made small in a portion where an obstacle is present in the vicinity, whereas the scanning width is made large in a portion where any obstacle is not present in the vicinity. As a result, an auxiliary conduction film pattern 101 as shown in FIG. 6C is obtained. Thereafter, the CVD gas for auxiliary conduction film is exhausted, and CVD gas for additional conductor is introduced. By using laser CVD, a low-resistance conductor is then formed only in a wide-width portion (or a relatively large area portion) of an additional conductor. A narrow-width portion (or a relatively small area portion) is formed by radiating the ion beam again in an atmosphere of CVD gas for additional conductor. In this way, a conductor is formed by the ion beam only in a small portion. Hence, burden is not caused from the viewpoint of time, and an increase in resistance value can be neglected as compared with the whole resistance value.

By forming an additional conduction path comprising one or more additional conductors and then, if necessary, directing, in a non-oxidizing atmosphere like vacuum, $N_2$ gas, inert gas such as Ar or He, or reducing gas such as $H_2$, a laser beam onto a conductor as described above, the conductor formed by the ion beam can also be made sufficiently low in resistance.

In the present embodiment, an extremely fine conductor is formed by a focused ion beam. However, it may be formed by laser CVD. That is to say, the deposition width can be made small by making the laser output sufficiently low or by making the condensed (focused) spot diameter small and the manipulation speed rapid. One additional conductor can be formed while changing the forming condition as occasion demands and changing the deposition width depending upon place. Although there is a limit (close to 1 μm width) in making the pattern time, the additional conductor pattern as shown in FIG. 6C can be formed by using only laser CVD.

Still another embodiment of an additional conductor forming method according to the present invention will now be described by referring to FIGS. 7A to 7C.

In case of the present embodiment, a pad for measuring a signal on a wiring conductor of a patterned conductor layer in a semiconductor IC device or for inputting a signal onto the wiring conductor is formed. This pad is used for pushing a fine needle against it or for wire boding.

Figure 7A:
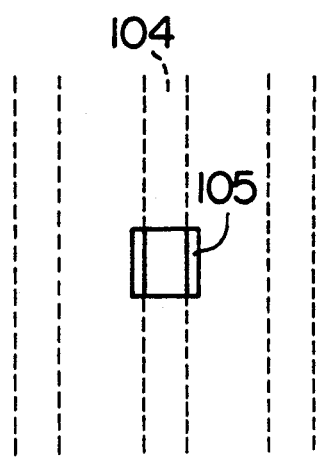
FIGS. 7A to 7C and 8A to 8C are diagrams for explaining interconnection modifying methods according to still other embodiments of the present invention.
Figure 7B:
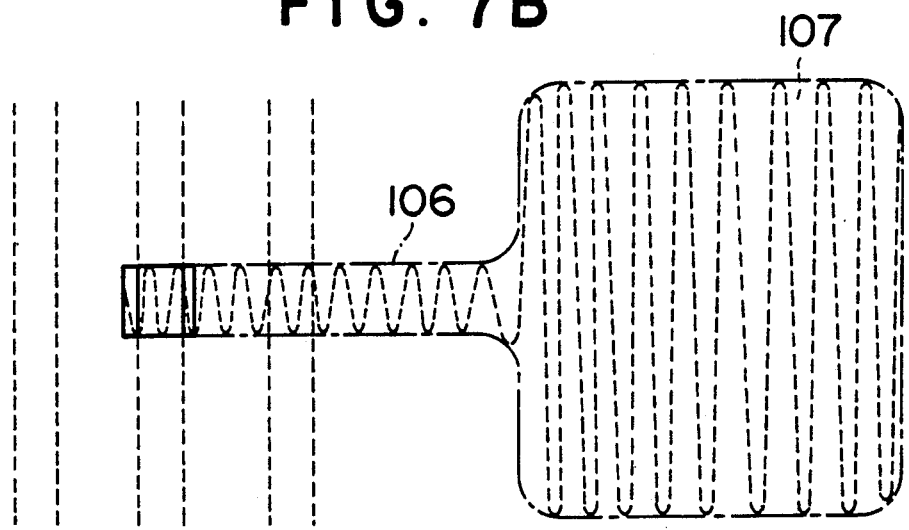
Figure 7C:
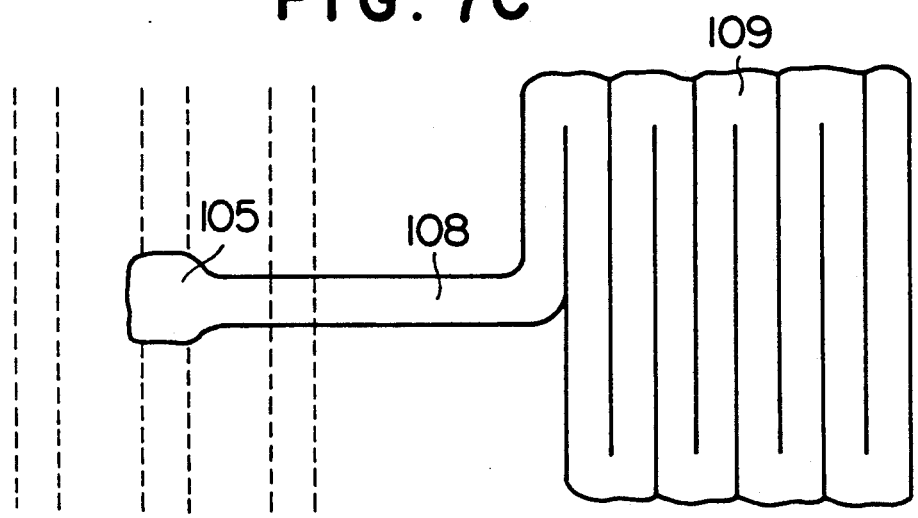

First of all, a hole 105 is formed in an insulating layer on a wiring conductor 104 to be measured or to be supplied with a signal, by a focused ion beam as shown in FIG. 7A. A part of the wiring conductor is thus exposed. While scanning a focused ion beam in an atmosphere of chromium carbonyl $Cr(CO)_6$ gas in the vertical direction of FIG. 7B and moving the stage, the focused ion seam is radiated. An auxiliary conduction film is thus formed in a conductor portion 106 and a pad portion 107 indicated by phantom lines. At this time, the auxiliary conduction film may be formed by using only deflection of the focused ion beam without moving the stage.

Thereafter, the chamber is once evacuated, and then molybdenum carbonyl $Mo(CO)_6$ is introduced. An Ar laser beam is then condensed and radiated. First of all, the Ar laser beam is radiated onto the connection hole 105 to fill up the hole 105 with Mo. The laser beam is successively scanned onto portions where the auxiliary conduction film is formed. An leading conductor 108 and then a pad 109 are thus formed.

Thereby, a pad having a sufficiently large area can be formed in a short time so that it may adhere well to an underlying insulating layer. Further, a film formed by using laser CVD has sufficiently low resistance. Therefore, high-precision measurement can be performed. When a signal is inputted as well, a waveform signal as desired can be inputted.

Further, since a sufficiently thick pad can be formed, there is no fear that an underlayer might be damaged even if wire bonding is performed.

Figure 8A:
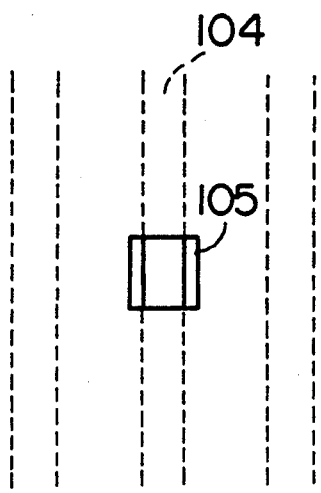
Figure 8B:
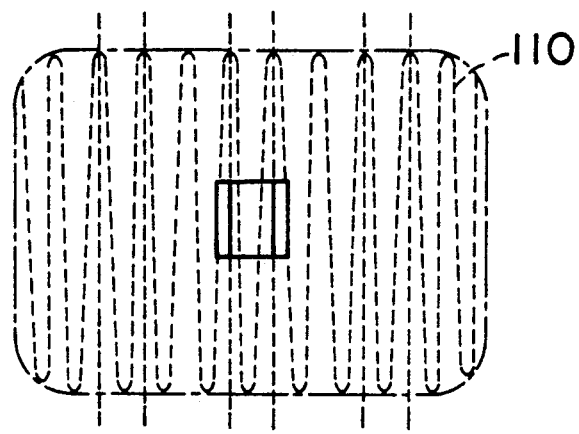
Figure 8C:
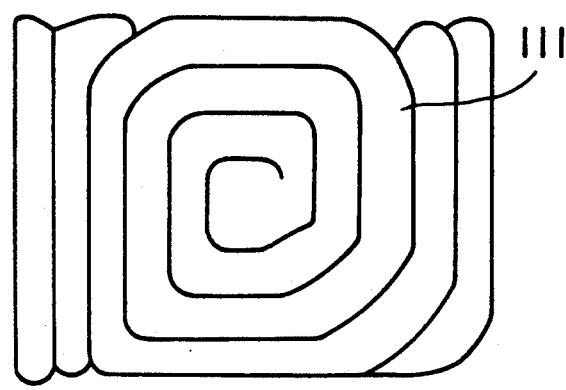

In the present embodiment, a pad is formed from a connection hole via an leading conductor. Even if a pad is formed so that the connection hole may be included within the pad, however, exactly the same effect is obtained. That is to say, a connection hole 05 is formed in an insulating layer located on an interconnecting conductor 104 to be measured or supplied with a signal, by using a focused ion beam as shown in FIG. 8A. A part of the wiring conductor 104 is exposed. Succeedingly, scanning is effected with the focused ion beam in an atmosphere of chromium carbonyl $Cr(CO)_6$ as represented by a broken line of FIG. 8B. An auxiliary conduction film is formed in a region 110 including the connection hole 105. The chamber is then evacuated once, and molybdenum carbonyl $Mo(CO)_6$ is introduced into the chamber. The Ar laser beam is then condensed and radiated. The Ar laser beam is first radiated onto the connection hole 105 to fill up the hole 105 with Mo. Thereafter, the region 110 is scanned with the laser beam, where the auxiliary conduction film is formed, to form a pad 111. Scanning at this time may be performed in a vortex form. The effect is not changed even if scanning is performed as shown in FIG. 7C.

By forming a pad and then radiating a laser beam onto a pad (including an extracting conductor) in vacuum, $N_2$ gas, inert gas such as Ar or He, or a reducing gas atmosphere such as $H_2$ while scanning with the laser beam as described above, the material quality of the Mo film can be improved and a pad having lower resistance can be obtained.

We claim:

1. A method of forming an additional connection wiring on a multilayer IC device, comprising the steps of:

forming at least one hole in an insulating layer on said multilayer IC device, by radiating a focused ion beam to expose a part of a conductive layer provided under said insulating layer on said multilayer IC device;

selectively depositing a patterned-interposed thin metal film, by scanning the multilayer IC device with a focused ion beam due to relative movement between the focused ion beam and the multilayer IC device, so as to form said patterned-interposed thin metal film, the focused ion beam being radiated in an atmosphere of a metal compound gas onto said hole and onto a predetermined portion of said surface of said insulating layer; and selectively depositing said additional connection wiring by scanning the multilayer IC device with a focused laser beam due to relative movement between the laser beam and the multilayer IC device, so as to form said additional connection wiring, the focused layer beam being radiated in an atmosphere of a conductor metal compound gas on said patterned-interposed thin metal film so that said additional connection wiring is electrically connected with said conductive layer.

2. A method according to claim 1, wherein said insulating layer is formed of $SiO_2$, and said metal compound gas is formed of a Cr compound gas so that said patterned-interposed thin metal film is deposited as a patterned-interposed thin or film.

3. A method according to claim 1, wherein the patterned-interposed thin metal film is made of metal, and has a thickness, such that adherence between the insulating layer and the thin metal film, and between the thin metal film and additional connection wiring, are greater than that between the insulating layer and the additional metal wiring, and such that the patterned-interposed thin metal film acts as a shield to prevent transmission of said focused laser beam.

4. A method according to claim 3, wherein each of the thin metal film and the additional connection wiring are selectively deposited by a selective chemical vapor deposition.

5. A method according to claim 1, wherein the additional connection wiring is selectively deposited only on the patterned-interposed thin metal film.

6. A method according to claim 1, wherein each of the thin metal film and the additional connection wiring are selectively deposited by a selective chemical vapor deposition.

7. A method according to claim 1, wherein the thin metal film has a thickness of 100–300Å.

8. A method according to claim 1, wherein the metal compound gas and the conductor metal compound gas are selected from the group consisting of metal carbonyl compound, metal-containing halogen compound and metal-containing alkyl compound.

9. A method according to claim 1, wherein the metal compound gas and conductor metal compound gas are selected from the group consisting of $CR(CO)_6$, $Mo(CO)_6$, $W(CO)_6$, $Ni(CO)_6$, $MoH_6$, $WF_6$, $MOCl_5$, $Al(CH_3)_3$, $CD(CH_3)_2$ and $Al(iso-butyl)_3$.

10. A method according to claim 1, wherein the metal compound gas is $Cr(CO)_6$, and the conductor metal compound gas is $Mo(CO)_6$.

11. A method according to claim 1, wherein said additional connection wiring includes a bonding pad, electrically connection wiring includes a bonding pad, electrically connected to said conductive layer.

12. A method according to claim 1, wherein the additional connection wiring is electrically connected to the conductive layer via the patterned-interposed thin metal film.

13. A method according to claim 1, wherein said patterned-interposed thin metal film includes a relatively small area portion and a relatively large area portion, and said additional connection wiring forming step is performed by directing an ion beam onto said relatively small area portion of said patterned film in an atmosphere containing said conductor metal compound gas to form a first portion of said additional connection wiring and by directing said focused laser beam onto said relatively large area portion of said patterned-interposed thin metal film in an atmosphere containing said conductor metal compound gas to form a second portion of said additional connection wiring, thereby providing the additional connection wiring having a relatively small area portion and a relatively large area portion.

14. A method according to claim 13, wherein the IC device includes a region having obstacles, the thin metal film and additional connection wiring being provided on said region having obstacles and on another region of the device, and wherein the relatively small area portion is provided on the region having obstacles and the relatively large area portion is provided on said another region of the device.

15. A method according to claim 1, further comprising the step of removing at least a part of a conductive layer of the IC device for disconnection.

16. A method according to claim 1, further comprising the step of subjecting said additional connection wiring and said patterned-interposed thin metal film underlying said additional connection wiring to a laser beam in a non-oxidizing atmosphere to thereby lower the electrical resistance of a combination of said additional connection wiring and said patterned-interposed thin metal film.

17. A method of forming an additional connection wiring on a multilayer IC device, comprising the steps of:

forming at least one hole in an insulating layer on said multilayer IC device, by radiating a focused ion beam to expose a part of a conductive layer provided under said insulating layer on said multilayer IC device;

selectively depositing a patterned-interposed thin metal film, by scanning the multilayer IC device with a focused ion beam due to relative movement between the focused ion beam and the multilayer IC device so as to form said patterned-interposed thin metal film, the focused ion beam being radiated in an atmosphere of a metal compound gas onto said hole and onto a predetermined portion of said surface of said insulating layer, an electron shower being directed, simultaneously with said focused ion beam radiation, onto the surface of the insulating layer, to neutralize electric charges accumulated on the surface of the insulating layer; and selectively depositing said additional connection wiring by scanning the multilayer IC device with a focused laser beam due to relative movement between the laser beam and the multilayer IC device so as to form said additional connection wiring, the focused laser beam being radiated in an atmosphere of a conductor metal compound gas on said patterned-interposed thin metal film so that said additional connection wiring is electrically connected with said conductive layer.

18. A method according to claim 17, wherein the step of forming the at least one hole an electron shower is directed, simultaneously with said focused ion beam radiation, onto a surface of the insulating layer, so as to neutralize electric charges accumulated on the surface of the insulating layer.

19. A method according to claim 14, wherein said insulating layer is formed of $SiO_2$, and said metal compound gas is formed of Cr compound gas so that said patterned-interposed thin metal film is deposited as a patterned-interposed thin Cr film.

20. A method according to claim 17, wherein the patterned-interposed thin metal film is made of a metal, and has a thickness, such that adherence between the insulating layer and the thin metal film, and between the thin metal film and additional connection wiring, are greater than that between the insulating layer and the additional metal wiring, and such that the patterned-interposed thin metal film acts as a shield to prevent transmission of said focused laser beam.

21. A method according to claim 20, wherein each of the thin metal film and the additional connection wiring are selectively deposited by a selective chemical vapor deposition.

22. A method according to claim 17, wherein each of the thin metal film and the additioanl connection wiring are selectively deposited by a selective chemical vapor deposition.

23. A method according to claim 17, wherein said patterned-interposed thin metal film includes a relatively small area portion and a relatively large area portion, and wherein an ion beam is directed onto said relatively small area portion of said patterned-interposed thin metal film in an atmosphere containing said conductor metal compound gas to form a first portion of said additioanl connection wiring and said focused laser beam is directed onto said relatively large area portion of said patterned-interposed thin metal film in an atmosphere containing said conductor metal compound gas to form a second portion of said additional connection wiring, thereby providing the additioanl connection wiring having a relatively small area portion and a relatively large area portion.

24. A method according to claim 17, in which at least a part of a conductive layer of the IC device is removed for disconnection by radiating a focused ion beam.

25. A method according to claim 24, wherein said at least a part of said conductive layer is removed by said focused ion beam used in the step of forming said at least one hole.

26. A method according to claim 17, further comprising the step of subjecting said additional connection wiring and said patterned-interposed thin metal film underlying said additional connection wiring to a laser beam in a non-oxidizing atmosphere to thereby lower the electrical resistance of a combination of said additional connection wiring and said patterned-interposed thin metal film.

* * * * *